United States Patent
Chang

(10) Patent No.: US 7,408,181 B2
(45) Date of Patent: Aug. 5, 2008

(54) PHASE-CHANGE MEMORY DEVICE AND METHOD OF MANUFACTURING THE SAME

(75) Inventor: Heon Yong Chang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 507 days.

(21) Appl. No.: 10/999,519

(22) Filed: Nov. 30, 2004

(65) Prior Publication Data

US 2006/0003263 A1    Jan. 5, 2006

(30) Foreign Application Priority Data

Jun. 30, 2004    (KR) .................. 10-2004-0050118

(51) Int. Cl.
*H01L 27/24* (2006.01)

(52) U.S. Cl. ............... 257/4; 257/2; 257/3; 257/774; 257/E45.002

(58) Field of Classification Search ............... 257/2–4, 257/E45.002
See application file for complete search history.

(56) References Cited

U.S. PATENT DOCUMENTS

| | | | | |
|---|---|---|---|---|
| 6,300,684 | B1 * | 10/2001 | Gonzalez et al. | 257/774 |
| 7,049,623 | B2 * | 5/2006 | Lowrey | 257/3 |
| 2005/0019975 | A1 * | 1/2005 | Lee et al. | 438/95 |

FOREIGN PATENT DOCUMENTS

KR    10-2004 0038422    5/2004

* cited by examiner

*Primary Examiner*—Jerome Jackson
*Assistant Examiner*—Jose R Diaz
(74) *Attorney, Agent, or Firm*—Ladas & Parry LLP

(57) ABSTRACT

Disclosed are a phase-change memory device and its manufacturing method, which can reduce a contact area between a bottom electrode and a phase-change layer, thereby reducing the quantity of current necessary for phase change. The phase-change memory device comprises: a bottom electrode formed on a contact plug; a phase-change layer formed on the bottom electrode and having a shape of a character 'π'; and a top electrode formed on the phase-change layer.

4 Claims, 5 Drawing Sheets

PHASE-CHANGE MEMORY DEVICE AND METHOD OF MANUFACTURING THE SAME

BACKGROUND OF THE INVENTION

1. Field of the invention

The present invention relates to a phase-change memory device and method of manufacturing the same, and more particularly to a phase-change memory device and method of manufacturing the same, which can reduce a contact area between a bottom electrode and a phase-change layer, thereby reducing quantity of current.

2. Description of the Prior Art

As generally known in the art, memory devices can be classified into Random Access Memories (RAMs) which are volatile and lose stored information when power supplied thereto is interrupted and Read Only Memories (ROMs) which are non-volatile and keep information stored therein even when power supplied thereto is interrupted. The volatile RAMs include Dynamic RAMs (DRAMs) and Static RAMs (SRAMs) and the non-volatile ROMs include flash memory devices such as Electrically Erasable and Programmable ROMs (EEPROMs).

However, the DRAM, which is an excellent memory device as is well known in the art, requires a high charge-storage capacity for its periodic refresh operation, which consequently requires an increase of a surface area of an electrode, thereby making it difficult to achieve a high circuit integration. Further, the flash memory device requires higher operation voltage than a power supply voltage in relation to the lamination structure of two gates. Therefore, in the flash memory device, a separate voltage-booster circuit is necessary in order to obtain a voltage necessary for write and erase operations. In this regard also, the flash memory device disturbs high integration of a circuit.

Therefore, researches have been made into the development of a new non-volatile memory device capable of achieving high-integration and having a simple construction, one proposal for which is a phase-change memory device (phase-change RAM).

In the phase-change memory device, a phase-change layer interposed between a top electrode and a bottom electrode experiences a phase change from a crystalline state to an amorphous state by current flow between the top electrode and the bottom electrode, so that the phase-change memory device discriminates the information stored in the cell by means of resistance difference between the crystalline state and the amorphous state.

In other words, the phase-change memory device employs a chalcogenide film as the phase-change layer. The chalcogenide film is a compound material layer (hereinafter, referred to as "GST layer") consisting of germanium (Ge), stibium (Sb), and tellurium (Te) and causes a phase change between the crystalline state and the amorphous state by an applied current or Joule Heat. Here, the phase-change layer has a higher specific resistance in the amorphous state than in the crystalline state. Therefore, whether the information stored in the phase-change memory cell refers to a logic '1' or '0' can be determined by detecting the current flowing through the phase-change layer in the 'read' mode.

FIG. 1 is a sectional view of a conventional phase-change memory cell.

In the conventional phase-change memory cell as shown in FIG. 1, a interlayer dielectric 5 is formed on a bottom electrode 3 formed on a semiconductor substrate 1. Then, the interlayer dielectric 5 is etched to form a contact plug 7 electrically connected with source regions and a phase-change layer 9 is then formed on the resultant substrate having the contact plug 7 formed thereon. Thereafter, a top electrode 11 is formed on the phase-change layer 9.

When voltage is applied in order to program the phase change memory cell, heat is generated at an interface between the phase-change layer 9 and the contact plug 7, so that a portion 9a of the phase-change layer 9 is transformed into an amorphous state. The heat generated at the periphery C of the contact plug 7 and the phase-change layer 9 may be spread to the neighboring contact plug 7 and be unable to reach the temperature necessary for the phase change. Therefore, even after the phase-change layer is phase-changed into an amorphous state, there may remain an abnormal region (which is not changed into the amorphous state) at the periphery of the phase-change layer 9.

Further, in the 'read' and 'write' operations of the phase-change memory device, the large contact area between the bottom electrode and the phase-change layer requires an increased quantity of current for the phase change, thereby having a bad influence on the speed of the phase-change memory device.

SUMMARY OF THE INVENTION

Accordingly, the present invention has been made to solve the above-mentioned problems occurring in the prior art, and an object of the present invention is to provide a phase-change memory device and its manufacturing method, which can reduce a contact area between a bottom electrode and a phase-change layer, thereby reducing the quantity of current necessary for phase change.

In order to accomplish this object, there is provided a phase-change memory device comprising: a semiconductor substrate having a bottom structure; a interlayer dielectric formed on the semiconductor substrate to cover the bottom structure; a contact plug formed in the interlayer dielectric; a bottom electrode formed on the contact plug and a portion of the interlayer dielectric adjacent to the contact plug; a first oxide layer formed on the interlayer dielectric and the bottom electrode and having a contact hole for exposing the bottom electrode formed in the first oxide layer; a second oxide layer formed on the bottom electrode within the contact hole such that the bottom electrode is partially exposed; a phase-change layer formed between the second oxide layer and the side of the contact hole and on the second oxide layer and the partially exposed bottom electrode; and a top electrode formed on the phase-change layer.

It is preferred that each of the bottom electrode and the top electrode is formed of a polysilicon film or a metal film.

It is also preferred that the phase-change layer is formed on a portion of the first oxide layer adjacent to the contact hole as well as between the second oxide layer and the surface of the contact hole and on the second oxide layer.

In accordance with another aspect of the present invention, there is provided a phase-change memory device comprising: a bottom electrode formed on a contact plug; a phase-change layer formed on the bottom electrode and having a shape of a character 'π'; and a top electrode formed on the phase-change layer.

In accordance with still another aspect of the present invention, there is provided a method of manufacturing phase-change memory device, comprising the steps of: providing a semiconductor substrate having a bottom structure; forming a interlayer dielectric on the semiconductor substrate to cover the bottom structure; forming a contact plug within the interlayer dielectric; forming a bottom electrode on the contact plug and a portion of the interlayer dielectric adjacent to the contact plug; forming a first oxide layer on the interlayer dielectric layer and the bottom electrode; etching the first oxide layer to form a contact hole for exposing the bottom electrode; forming a spacer on a side surface of the contact hole; forming a second oxide layer inside of the spacer within the contact hole; removing the spacer; forming a phase-change layer between the second oxide layer and the side surface of the contact hole and on the second oxide layer and the partially exposed bottom electrode; and forming a top electrode on the phase-change layer.

Preferably, the surface of the first oxide layer is flattened by a CMP process after being formed.

Also, the each of the bottom electrode and the top electrode may be formed of a polysilicon film or a metal film.

More preferably, the spacer may be formed of a nitride film.

In accordance with still another aspect of the present invention, there is provided a method of manufacturing phase-change memory device, comprising the steps of: providing a semiconductor substrate having a bottom structure; forming a interlayer dielectric layer on the semiconductor substrate to cover the bottom structure; forming a contact plug within the interlayer dielectric; forming a bottom electrode on the contact plug and a portion of the interlayer dielectric adjacent to the contact plug; forming a first oxide layer on the interlayer dielectric and the bottom electrode; etching the first oxide layer to form a contact hole for exposing the bottom electrode; forming a spacer on a side surface of the contact hole; forming a second oxide layer inside of the spacer within the contact hole; removing the spacer; forming a phase-change layer between the second oxide layer and the side surface of the contact hole and on the second oxide layer and the partially exposed bottom electrode; forming a conductive layer on the phase-change layer; and etching the conductive layer to form a top electrode simultaneously while etching the phase-change layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
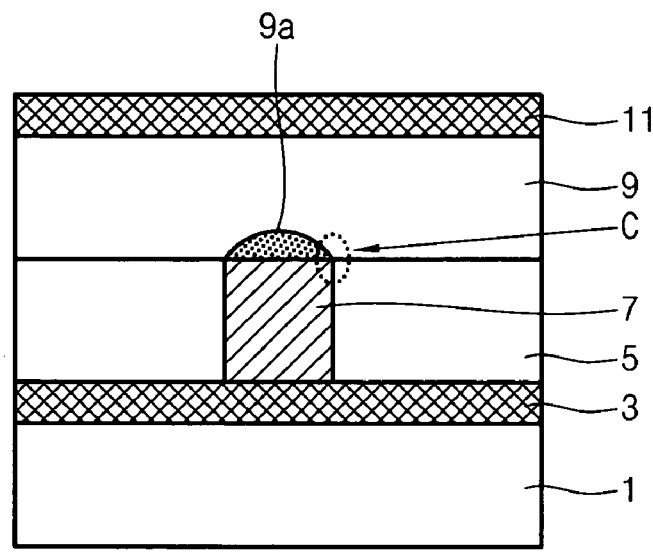
FIG. 1 is a sectional view of a conventional phase-change memory cell.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
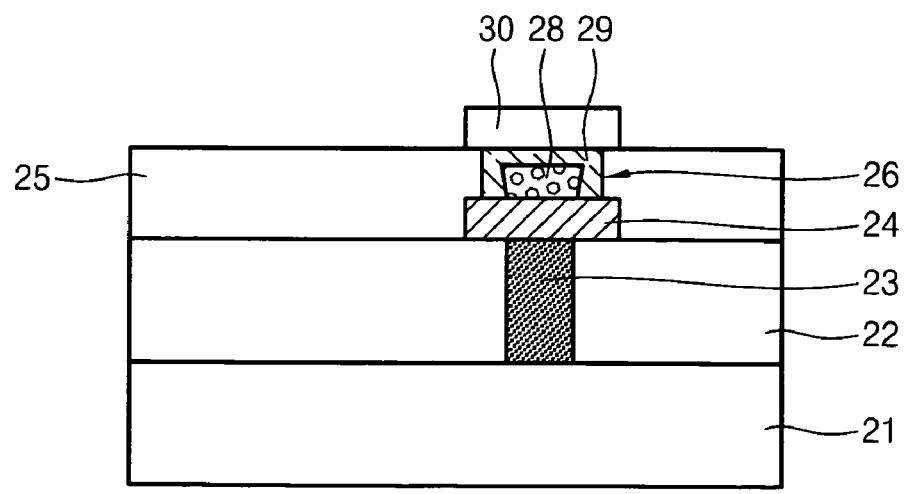
FIG. 2 is a sectional view of a phase-change memory device according to an embodiment of the present invention.

FIG. 2 is a sectional view of a phase-change memory device according to an embodiment of the present invention.

Referring to FIG. 2, in the phase-change memory device according to the present invention, a interlayer dielectric 22 is formed to cover a bottom structure (not shown) of a semiconductor substrate 21 and a contact plug 23 is then formed within the interlayer dielectric 22. Then, a bottom electrode 24 is formed on the contact plug 23 and a portion of the interlayer dielectric 22 adjacent to the contact plug 23. Then, a first oxide layer 25 is formed on the interlayer dielectric 22 and the bottom electrode 24, and a contact hole 26 for exposing the bottom electrode 24 is formed in the first oxide layer 25. A second oxide layer 28 is formed on the bottom electrode 24 within the contact hole 26 such that the bottom electrode 24 is partially exposed. A phase-change layer 29 is formed between the second oxide layer 28 and the surface of the contact hole 26 and on the second oxide layer 28. Also, the phase-change layer 29 may be formed on a portion of the first oxide layer 25 adjacent to the contact hole 26. A top electrode 30 is formed on the phase-change layer 29.

It is preferred that each of the bottom electrode 24 and the top electrode 30 is formed of a polysilicon film or a metal film.

In a 'read' or 'write' operation of the phase-change memory device, when heat is generated at a contact surface of the phase-change layer 29, the state of the phase-change layer 29 changes into an amorphous state or a crystalline state. In the phase-change memory device according to the present invention, since the phase-change layer 29 is formed between the second oxide layer 28 and the surface of the contact hole 26, on the second oxide layer 28, and on a portion of the first oxide layer 25 adjacent to the contact hole 26, the contact area A between the bottom electrode 24 and the phase-change layer 29 can be reduced. As a result, electric current necessary for phase change can be reduced and the speed of the phase-change memory device can be improved.

FIGS. 3A through 3F are sectional views showing a process of manufacturing a phase-change memory device according to an embodiment of the present invention.

Figure 3A:
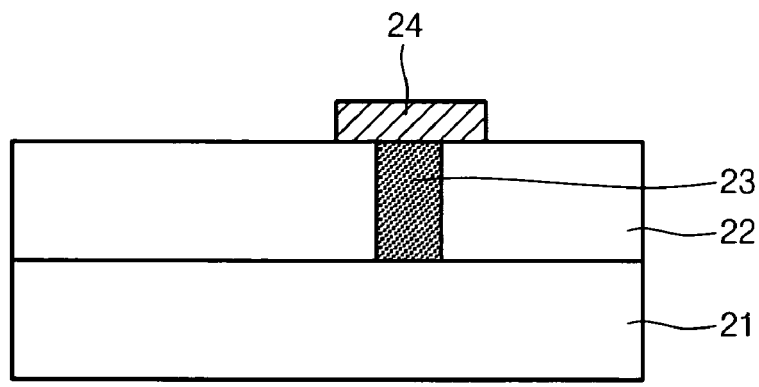
FIGS. 3A through 3F are sectional views showing a process of manufacturing a phase-change memory device according to an embodiment of the present invention.

As shown in FIG. 3A, the interlayer dielectric 22 is formed on the semiconductor substrate 21 having a bottom structure (not shown) to cover the bottom structure. Then, the interlayer dielectric 22 is etched to form the contact plug 23. Thereafter, the bottom electrode 24 is formed on the contact plug 23 and a portion of the interlayer dielectric 22 adjacent to the contact plug 23. Here, the bottom electrode 24 is formed of a polysilicon film or a metal film.

Figure 3B:
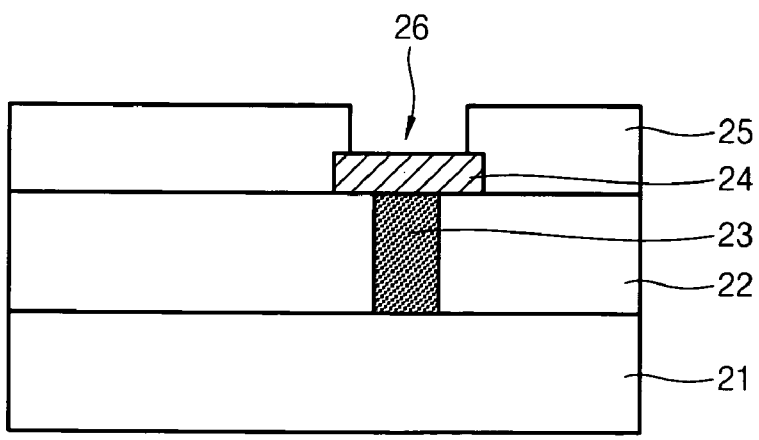

Referring to FIG. 3B, the first oxide layer 25 is formed on the interlayer dielectric 22 and the bottom electrode 24. Then, the surface of the first oxide layer 25 is flattened by a CMP process after being formed. Thereafter, the contact hole 26 for exposing the bottom electrode 24 is formed in the first oxide layer 25 by etching the first oxide layer 25.

Figure 3C:
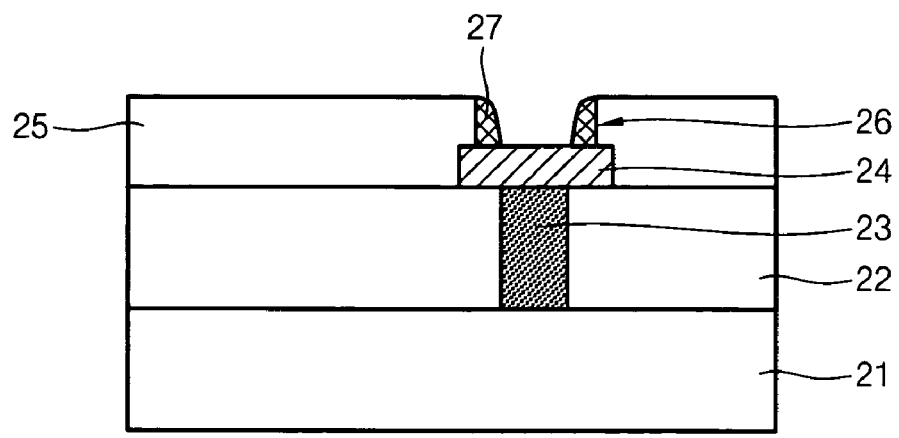

Referring to FIG. 3C, a spacer 27 is then formed on a side surface of the contact hole 26. Here, the spacer 27 is formed of a nitride film.

Figure 3D:
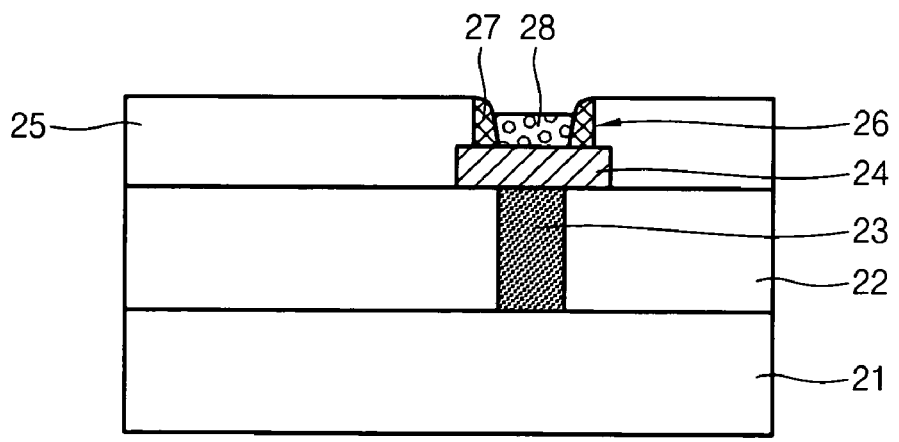

Referring to FIG. 3D, the second oxide layer 28 is then formed inside of the spacer 27 within the contact hole 26.

Figure 3E:
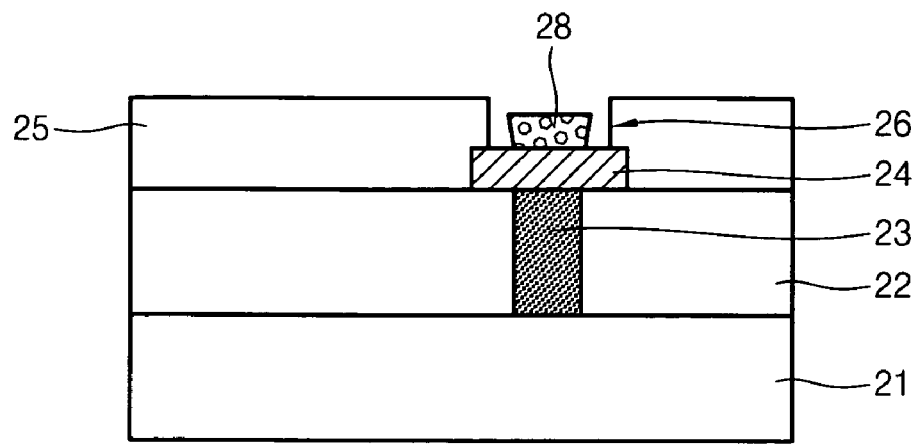

Next, as shown in FIG. 3E, the spacer 27 formed on the side surface of the contact hole 26 is removed by wet etching.

Figure 3F:
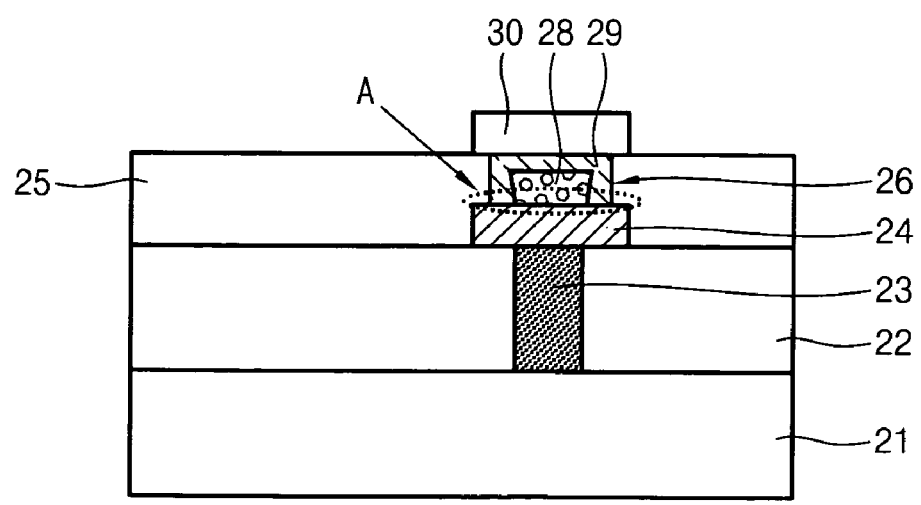

Referring to FIG. 3F, the phase-change layer 29 is then formed between the second oxide layer 28 and the surface of the contact hole 26 and on the second oxide layer 28. Thereafter, the top electrode 30 is formed on the phase-change layer 29. Herein, the phase-change layer 29 is formed of a polysilicon film or a metal film.

Figure 4:
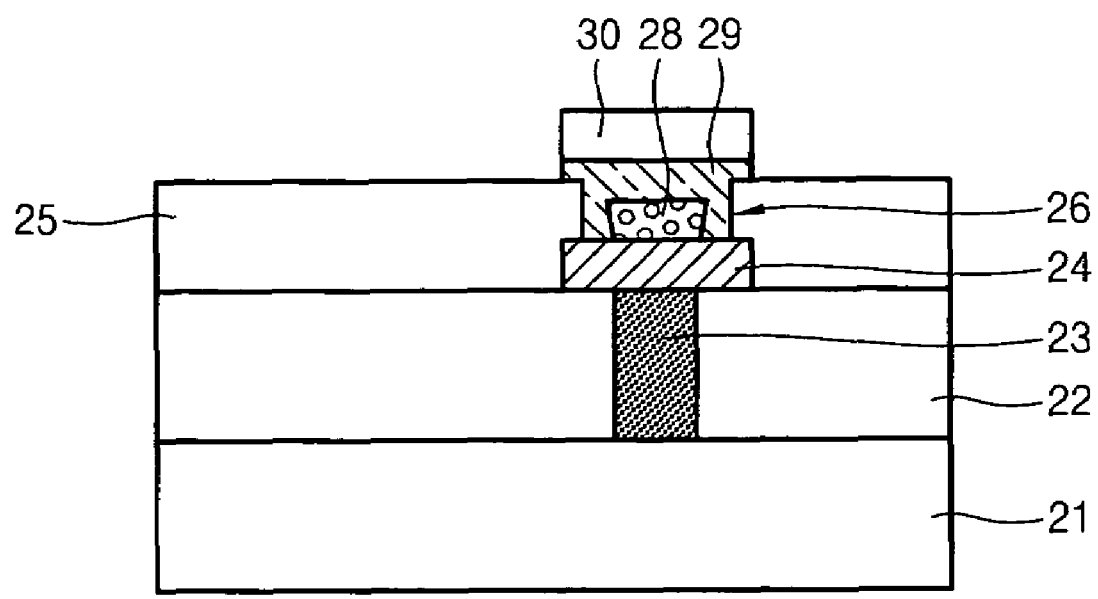
FIG. 4 is a sectional view illustrating a process of manufacturing a phase-change memory device according to another embodiment of the present invention.

FIG. 4 is a sectional view illustrating a process of manufacturing a phase-change memory device according to another embodiment of the present invention.

As shown in FIG. 4, the interlayer dielectric 22 is formed to cover a bottom structure of the semiconductor substrate 21. Then, the contact plug 23 is formed within the interlayer dielectric 22 and the bottom electrode 24 is then formed on the contact plug 23 and a portion of the interlayer dielectric 22 adjacent to the contact plug 23. Thereafter, the first oxide layer 25 is formed on the interlayer dielectric 22 and the bottom electrode 24, and the first oxide layer 25 is etched to form the contact hole 26 for exposing the bottom electrode 24.

Thereafter, a spacer (not shown) is formed on a side surface of the contact hole 26 and the second oxide layer 28 is then formed inside of the spacer within the contact hole 26. Then, the spacer is removed, and the phase-change layer 29 is formed between the second oxide layer 28 and the surface of the contact hole 26, on the second oxide layer 28, and on a portion of the first oxide layer 25 adjacent to the contact hole 26. Thereafter, a conductive layer for a top electrode is formed on the phase-change layer 29 and is then etched to form the top electrode 30 simultaneously while the phase-change layer 29 is etched.

According to the present invention as described above, a spacer is formed on a side surface of a contact hole, an oxide layer is formed to fill the contact hole, the spacer is then removed, and a phase-change layer is then formed in the spacer-removed portion and the oxide layer. As a result, the contact area between the bottom electrode and the phase-change layer is reduced, so that electric current necessary for the phase change can be reduced.

Also, such reduction of the electric current necessary for the phase change can consequently improve speed of the phase-change memory device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A phase-change memory device comprising:
   a semiconductor substrate having a bottom structure;
   a interlayer dielectric formed on the semiconductor substrate to cover the bottom structure;
   a contact plug formed within the interlayer dielectric;
   a bottom electrode formed on the contact plug and a portion of the interlayer dielectric adjacent to the contact plug;
   a first oxide layer formed on the interlayer dielectric and the bottom electrode and having a contact hole for exposing the bottom electrode formed in the first oxide layer;
   a second oxide layer formed on the bottom electrode within the contact hole formed within the first oxide layer, such that a portion of the bottom electrode surrounding the second oxide layer is exposed;
   a phase-change layer formed between the second oxide layer and the side surface of the contact hole formed within the first oxide layer and on the second oxide layer and the exposed portion of the bottom electrode, such that exposed outer portions of the second oxide layer are covered by the phase-change layer; and
   a top electrode formed on the phase-change layer.

2. The phase-change memory device as claimed in claim 1, wherein each of the bottom electrode and the top electrode is formed of a polysilicon film or a metal film.

3. The phase-change memory device as claimed in claim 1, wherein the phase-change layer is formed on a portion of the first oxide layer adjacent to the contact hole as well as between the second oxide layer and the surface of the contact hole and on the second oxide layer.

4. A phase-change memory device comprising:
   a bottom electrode formed on a contact plug;
   an oxide layer formed on the bottom electrode
   a phase-change layer formed on the bottom electrode and the oxide layer, such that the phase-change layer surrounds outer surfaces of the oxide layer to form a sectional shape of a character 'π'; and
   a top electrode formed on the phase-change layer.

* * * * *